(12) United States Patent
Lius et al.

(10) Patent No.: US 12,229,357 B2
(45) Date of Patent: Feb. 18, 2025

(54) ELECTRONIC DEVICE

(71) Applicant: InnoLux Corporation, Chu-Nan (TW)

(72) Inventors: Chandra Lius, Chu-Nan (TW); Kuan-Feng Lee, Chu-Nan (TW); Tsung-Han Tsai, Chu-Nan (TW); Pai-Chiao Cheng, Chu-Nan (TW)

(73) Assignee: INNOLUX CORPORATION, Chu-Nan (TW)

( * ) Notice: Subject to any disclaimer, the term of this patent is extended or adjusted under 35 U.S.C. 154(b) by 0 days.

(21) Appl. No.: 18/342,714

(22) Filed: Jun. 27, 2023

(65) Prior Publication Data

US 2023/0341957 A1    Oct. 26, 2023

Related U.S. Application Data

(63) Continuation of application No. 17/820,229, filed on Aug. 16, 2022, now Pat. No. 11,726,591, which is a (Continued)

(51) Int. Cl.
| | |
|---|---|
| *G06F 3/041* | (2006.01) |
| *G06V 10/147* | (2022.01) |
| *H01L 27/15* | (2006.01) |
| *H10K 59/40* | (2023.01) |
| *G02F 1/1333* | (2006.01) |
| *G02F 1/1335* | (2006.01) |
| *G02F 1/13357* | (2006.01) |
| *H01L 27/146* | (2006.01) |
| *H10K 59/65* | (2023.01) |

(52) U.S. Cl.
CPC ............ *G06F 3/041* (2013.01); *G06V 10/147* (2022.01); *G02F 1/13338* (2013.01); *G02F 1/133514* (2013.01); *G02F 1/133617* (2013.01); *H01L 27/14678* (2013.01); *H01L 27/156* (2013.01); *H10K 59/40* (2023.02); *H10K 59/65* (2023.02)

(58) Field of Classification Search
CPC ...... G06F 3/041; G06V 10/147; G06V 40/13; G02F 1/13338; G02F 1/133617; G02F 1/133514; G02F 2201/58; H10K 59/40; H10K 59/65; H10K 39/34; H01L 27/156; H01L 27/14678
See application file for complete search history.

(56) References Cited

U.S. PATENT DOCUMENTS

| | | | |
|---|---|---|---|
| 11,726,591 B2 * | 8/2023 | Lius ........................ | G06F 3/041 345/173 |
| 2017/0220844 A1 | 8/2017 | Jones et al. | |

(Continued)

*Primary Examiner* — Nitin Patel
*Assistant Examiner* — Amen W Bogale
(74) *Attorney, Agent, or Firm* — MUNCY, GEISSLER, OLDS & LOWE, P.C.

(57) ABSTRACT

An electronic device is disclosed, which includes: a substrate including a biometric sensing region and a non-sensing region; a biometric sensing module disposed corresponding to the biometric sensing region; a display layer disposed on the substrate; a light altering member at least partially disposed in the biometric sensing region; a touch sensing layer disposed on the display layer; and a supporting element disposed between the substrate and the biometric sensing module, wherein the light altering member includes a first insulating layer and a micro-structure layer disposed on the first insulating layer.

9 Claims, 6 Drawing Sheets

Related U.S. Application Data continuation of application No. 17/323,792, filed on May 18, 2021, now Pat. No. 11,443,499, which is a continuation of application No. 16/046,088, filed on Jul. 26, 2018, now abandoned.

(56) References Cited

U.S. PATENT DOCUMENTS

| | | | |
|---|---|---|---|
| 2019/0012555 A1* | 1/2019 | Bae | G06V 40/1324 |
| 2020/0019747 A1* | 1/2020 | Yang | H10K 59/65 |
| 2022/0398821 A1 | 12/2022 | Lius et al. | |

* cited by examiner

ELECTRONIC DEVICE

CROSS REFERENCE TO RELATED APPLICATION

This application is a continuation of U.S. patent application for "Electronic device", U.S. application Ser. No. 17/820,229 filed on Aug. 16, 2022; U.S. application Ser. No. 17/820,229 is a continuation of U.S. application Ser. No. 17/323,792 filed on May 18, 2021; U.S. application Ser. No. 17/323,792 is a continuation of U.S. application Ser. No. 16/046,088 filed on Jul. 26, 2018, and the subject matter of which is incorporated herein by reference.

BACKGROUND

1. Field

The present disclosure relates to an electronic device. More particularly, the present disclosure relates to an electronic device with a biometric sensing function.

2. Description of Related Art

With the continuous advancement of technologies related to electronic devices, all the electronic devices are now developed toward compactness, thinness, and lightness. For example, thin display devices are the mainstream display devices on the market.

Nowadays, the electronic devices, for example, the display devices are required to have not only the display function but also other functions such as touch or identification functions. In addition, for the display devices to have higher display-to-body ratio, sensors of the display devices have to be embedded into display regions of the display devices.

When the sensors are integrated to the electronic devices, users have to input a demand to turn on the electronic device to further access the sensing process. But, while at bright condition, it is difficult for the user to see or know where the sensing region with the sensors disposed therein is. Therefore, it is desired to provide an electronic device that the user could distinguish the sensing region from the non-sensing region.

SUMMARY

The present disclosure provides an electronic device, which comprises: a substrate comprising a biometric sensing region and a non-sensing region; a biometric sensing module disposed corresponding to the biometric sensing region; a display layer disposed on the substrate; a light altering member at least partially disposed in the biometric sensing region; a touch sensing layer disposed on the display layer; and a supporting element disposed between the substrate and the biometric sensing module, wherein the light altering member comprises a first insulating layer and a microstructure layer disposed on the first insulating layer.

Other novel features of the disclosure will become more apparent from the following detailed description when taken in conjunction with the accompanying drawings.

DETAILED DESCRIPTION OF EMBODIMENT

The following embodiments when read with the accompanying drawings are made to clearly exhibit the above-mentioned and other technical contents, features and/or effects of the present disclosure. Through the exposition by means of the specific embodiments, people would further understand the technical means and effects the present disclosure adopts to achieve the above-indicated objectives. Moreover, as the contents disclosed herein should be readily understood and can be implemented by a person skilled in the art, all equivalent changes or modifications which do not depart from the concept of the present disclosure should be encompassed by the appended claims.

Furthermore, the ordinals recited in the specification and the claims such as "first", "second" and so on are intended only to describe the elements claimed and imply or represent neither that the claimed elements have any proceeding ordinals, nor that sequence between one claimed element and another claimed element or between steps of a manufacturing method. The use of these ordinals is merely to differentiate one claimed element having a certain designation from another claimed element having the same designation.

Furthermore, the terms recited in the specification and the claims such as "above", "over", or "on" are intended not only directly contact with the other element, but also intended indirectly contact with the other element. Similarly, the terms recited in the specification and the claims such as "below", or "under" are intended not only directly contact with the other element but also intended indirectly contact with the other element.

Furthermore, the terms recited in the specification and the claims such as "connect" is intended not only directly connect with other element, but also intended indirectly connect and electrically connect with other element.

Furthermore, when a value is in a range from a first value to a second value, the value can be the first value, the second value, or another value between the first value and the second value.

In addition, the features in different embodiments of the present disclosure can be mixed to form another embodiment.

Figure 1:
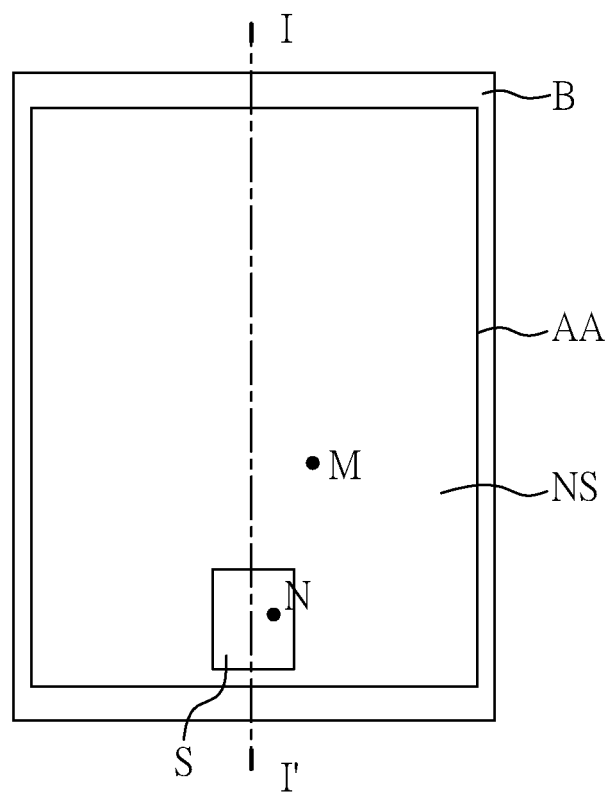
FIG. 1 is a top view of an electronic device according to one embodiment of the present disclosure.

FIG. 1 is a top view of an electronic device according to one embodiment of the present disclosure. The electronic device comprises: a display area AA comprising a biometric sensing region S and a non-sensing region NS; and a border area B. The border area B is adjacent to the display area AA, and the biometric sensing region S is adjacent to the non-sensing region NS. In one embodiment, the biometric sensing region S is enclosed by the non-sensing region NS. Hence, the electronic device of the present embodiment can perform not only the display function but also the sensing function. Herein, the biometric sensing region S is a region disposed with at least one sensing unit. Examples of the sensing unit capable of using in the electronic device of the present embodiment may comprise a fingerprint sensor, an iris sensor, a retina sensor, a facial sensor, a vein sensor, a voice sensor, a motion sensor, a gesture sensor or a DNA sensor, but the present disclosure is not limited thereto.

In the present embodiment, the biometric sensing region S has smaller surface area than the non-sensing region NS. In one aspect of the present disclosure, the surface area of the biometric sensing region S could be larger than 250,000 $\mu m^2$ (i.e. 500 $\mu m \times 500$ $\mu m$), but the present disclosure is not limited thereto. In another aspect of the present disclosure, the surface area of the biometric sensing region S could be equal to or smaller than the surface area of the display area AA, for example, the surface area of the biometric sensing region S is a third of the surface area of the display area AA or less, but the present disclosure is not limited thereto. In one embodiment, if the surface area of the biometric sensing region S equals to the surface area of the display area AA, different reflectivity might still be found in different regions in the display area AA in accordance with design of sensing units. The surface area of the biometric sensing region S can be adjusted according to the user's requirement, as long as the biometric sensing region S locates within the display area AA. In the present embodiment, the surface area of the biometric sensing region S could be calculated by measuring an area of a region projected on a substrate. For example, the surface area of the biometric sensing region S is an area of a projection of the biometric sensing region S on a substrate (e.g. a first substrate 11 in FIG. 2).

When the sensors are integrated to the electronic devices, users have to input a demand to turn on the electronic device to further access the sensing process. Sometimes it may be difficult for the user to see or know where the biometric sensing region S is (for example, under the sun). In the present embodiment, a reflectivity of the biometric sensing region S is designed to be different from a reflectivity of the non-sensing region NS to help the users to distinguish the biometric sensing region S from the non-sensing region NS.

In one aspect of the present disclosure, the reflectivity of the biometric sensing region S is greater than the reflectivity of the non-sensing region NS.

Hereinafter, several embodiments are provided to show how to design the reflectivity of the biometric sensing region S different from the reflectivity of the non-sensing region NS, but the present disclosure is not limited to the following embodiments.

Embodiment 1

Figure 2:
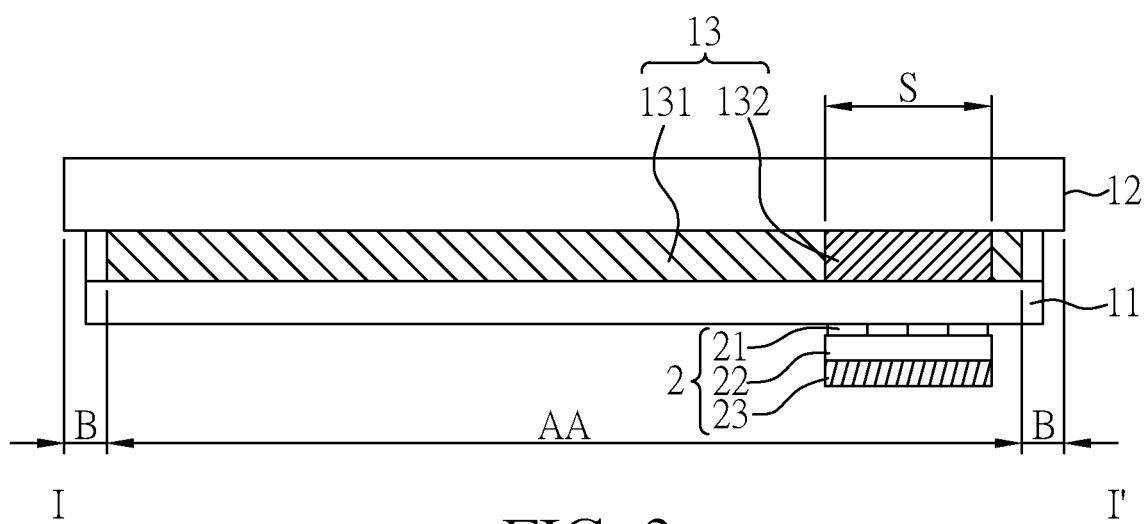
FIG. 2 is a cross-sectional view of an electronic device according to Embodiment 1 of the present disclosure.

FIG. 2 is a cross-sectional view of an electronic device along a line I-I' in FIG. 1 according to the present embodiment.

As shown in FIG. 1 and FIG. 2, the electronic device of the present embodiment comprises: a first substrate 11; and a display layer 13 disposed on the first substrate 11, wherein the display layer 13 comprises a first display region 131 and a second display region 132, the first display region 131 corresponds to the non-sensing region NS, and the second display region 132 corresponds to the biometric sensing region S. In addition, the electronic device of the present embodiment further comprises: a cover substrate 12 disposed on the display layer 13.

Even not shown in the figure, the display layer 13 may comprises transistors, conductive lines, conductive pads, and/or any other element. The first substrate 11 and the cover substrate 12 can respectively be a quartz substrate, a glass substrate, a wafer, a sapphire substrate, or any other suitable substrate. The first substrate 11 and the cover substrate 12 can also be a flexible substrate or a film respectively, and the material of which can comprise polycarbonate (PC), polyimide (PI), polypropylene (PP), polyethylene terephthalate (PET), or other plastic material. In another embodiment of the present disclosure, the cover substrate 12 can be replaced by an encapsulating layer, a polarizer or other suitable film.

Even not shown in the figure, the electronic device of the present embodiment may further comprise a display medium layer disposed between the display layer 13 and the cover substrate 12. The display medium layer may comprise liquid crystals (LCs), quantum dots (QDs), fluorescence molecules, phosphors, organic light-emitting diodes (OLEDs), inorganic light-emitting diodes (LEDs), mini light-emitting diodes (mini-LEDs), micro light-emitting diodes (micro-LEDs), or quantum-dot light-emitting diodes (QLEDs). It could be understood that the chip size of the LED can be 300 $\mu m$ to 10 mm, the chip size of the mini-LED can be 100 $\mu m$ to 300 $\mu m$, and the chip size of the micro-LED can be 1 $\mu m$ to 100 $\mu m$. But the present disclosure is not limited thereto. In one embodiment of the present disclosure, if the display medium layer comprises LCs, the border area B in the cross-sectional view may comprise sealant or any other suitable elements. In another embodiment of the present disclosure, if the display medium layer comprises OLEDs, the border area B in the cross-sectional view may comprise organic-inorganic layers of dam or any other suitable elements. In the embodiment of the present disclosure, if the display medium layer comprises LEDs, mini-LEDs or micro-LEDs, the border area B in the cross-sectional view may comprise multiple layers of inorganic or organic material, patterned glass frit, sealant or any other suitable elements, but the present disclosure is not limited thereto.

In the present embodiment, a biometric sensing module 2 is disposed under the first substrate 11 and corresponds to the biometric sensing region S and the second display region 132. The biometric sensing module 2 may comprises an optical sensing unit 21, a sensing layer 22 and a sensing circuit layer 23, wherein the sensing layer 22 is disposed between the optical sensing unit 21 and the sensing circuit layer 23, and the sensing layer 22 is electrically connected to the sensing circuit layer 23. The optical sensing unit 21 could be PN diode capable of detecting light signal, while the sensing layer 22 could be the layers used to make the thin film transistor or any other transistor capable of controlling the PN diode. The sensing circuit layer 23 could comprise a circuit IC. For example, the sensing circuit layer 23 could be circuits or IC formed on a substrate (e.g. the material used for the first substrate 11 as mentioned above, like glass, polyimide, PET, silicon, etc), or the sensing circuit layer 23 could be electrically connected to IC through a printed circuit board (PCB) or a flexible printed circuit board (FPC). But, the present disclosure is not limited thereto. In another embodiment of the present disclosure, the sensing layer 22 may be disposed on the first substrate 11 and formed together with the display layer 13 (or the display medium layer), and the sensing circuit layer 23 is disposed under the first substrate 11 and electrically connected with the sensing layer 22. In further another embodiment of the present disclosure, the sensing circuit layer 23 is disposed under the first substrate 11, a part of the sensing layer 22 may be disposed on the first substrate 11 and formed together with the display layer 13 (or the display medium layer), and a part of the sensing layer 22 may be disposed between the first substrate 11 and the sensing circuit layer 23. In one embodiment, the sensing layer 22 may be formed together with the display layer 13. However, the present disclosure is not limited thereto.

In the present embodiment, a reflectivity of the first display region 131 is different from a reflectivity of the second display region 132. In one aspect of the present embodiment, the reflectivity of the first display region 131 is less than the reflectivity of the second display region 132.

In one embodiment, to accomplish the purpose of the reflectivity difference between the first display region 131 and the second display region 132, the density of the conductive lines in the first display region 131 can be different from the density of the conductive lines in the second display region 132, or the density of the conductive pads in the first display region 131 can be different from the density of the conductive pads in the second display region 132. However, the manner to accomplish the reflectivity difference between the first display region 131 and the second display region 132 is not limited to those stated above.

In the present embodiment, because there is a reflectivity difference between the first display region 131 and the second display region 132, it could help the users to distinguish the biometric sensing region S corresponding to the second display region 132 from the non-sensing region NS corresponding to the first display region 131.

Embodiment 2

Figure 3:
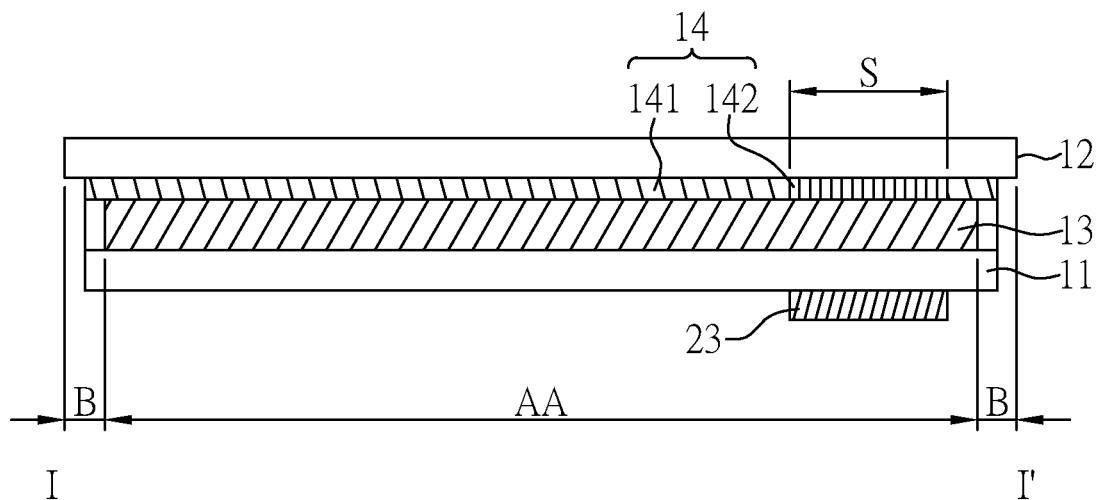
FIG. 3 is a cross-sectional view of an electronic device according to Embodiment 2 of the present disclosure.

FIG. 3 is a cross-sectional view of an electronic device along a line I-I' in FIG. 1 according to the present embodiment. The electronic device of the present embodiment is similar to the electronic device of Embodiment 1, except for the following differences.

In the present embodiment, the display layer 13 does not comprise the first display region 131 and the second display region 132 as shown in FIG. 2. In addition, the sensing layer 22 shown in FIG. 2 is integrated with a touch sensing layer 14 in the present embodiment.

As shown in FIG. 1 and FIG. 3, the electronic device of the present embodiment further comprises: a touch sensing layer 14 disposed on the first substrate 11, wherein the touch sensing layer 14 comprises a first touch sensing region 141 and a second touch sensing region 142, the first touch sensing region 141 corresponds to the non-sensing region NS, the second touch sensing region 142 corresponds to the biometric sensing region S, and a reflectivity of the first touch sensing region 141 is different from a reflectivity of the second touch sensing region 142. Herein, at least one touch unit (not shown in the figure) is disposed in the first touch sensing region 141, and at least one sensing unit (not shown in the figure) is disposed in the second touch sensing region 142. Herein, the at least one sensing unit could have both sensing function and touch function, but the present disclosure is not limited thereto. The sensing function and touch function of the at least one sensing unit could be driven or controlled by a controller, (e.g. ICs, etc) so as the at least one sensing unit could detect biometric data at one particular period, while at the other particular period of time, the at least one sensing unit could detect touch data.

Herein, the touch sensing layer 14 is disposed on the display layer 13, so the electronic device of the present embodiment is an in-cell touch electronic device. In another embodiment of the present disclosure, the electronic device may further comprise a display medium layer disposed on the display layer 13, and the touch sensing layer 14 is disposed between the display medium layer and the cover substrate 12; so the electronic device is an on-cell touch electronic device. In further another embodiment of the present disclosure, the touch sensing layer 14 can be disposed outside the cover substrate 12, so the electronic device is an out-cell touch electronic device.

In the present embodiment, a reflectivity of the first touch sensing region 141 is different from a reflectivity of the second touch sensing region 142. In one aspect of the present embodiment, the reflectivity of the first touch sensing region 141 is less than the reflectivity of the second touch sensing region 142.

Herein, various manners can be used to make the reflectivity differences between the first touch sensing region 141 and the second touch sensing region 142. For example, the density of the conductive lines in the first touch sensing region 141 can be different from the density of the conductive lines in second touch sensing region 142, the material comprised in the conductive lines in the first touch sensing region 141 can be different from the material comprised in the conductive lines in the second touch sensing region 142, or the density or the material of the touch units in the first touch sensing region 141 can be different from the density or the material of the touch units or the sensing units in the second touch sensing region 142. However, the present disclosure is not limited thereto.

In the present embodiment, because there is a reflectivity difference between the first touch sensing region 141 and the second touch sensing region 142, it could help the users to distinguish the biometric sensing region S corresponding to the second touch sensing region 142 from the non-sensing region NS corresponding to the first touch sensing region 141.

Embodiment 3

Figure 4:
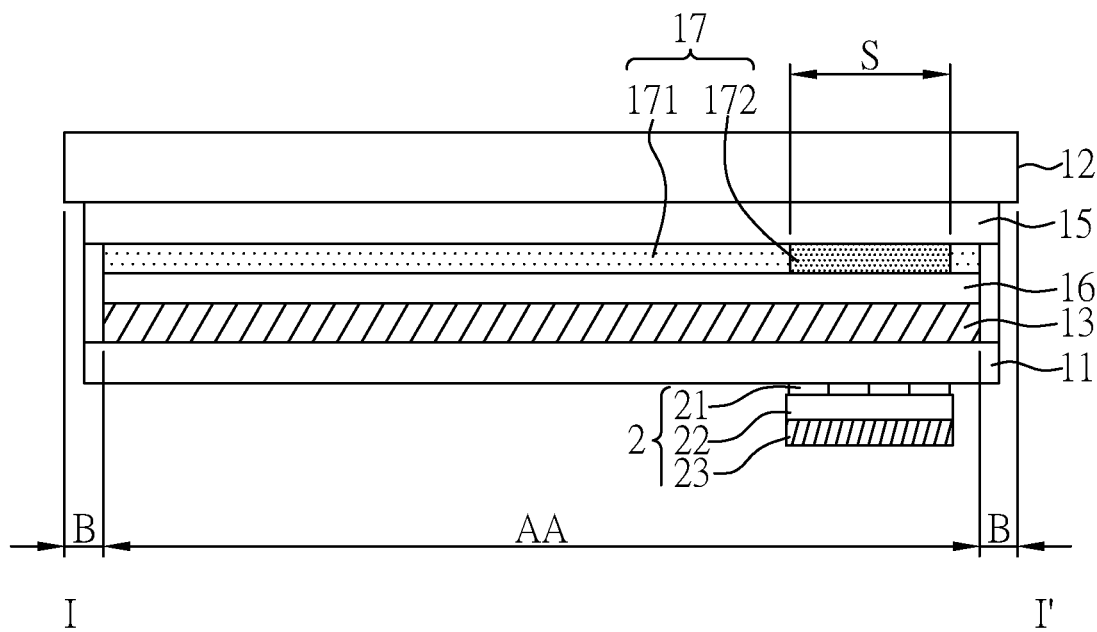
FIG. 4 is a cross-sectional view of an electronic device according to Embodiment 3 of the present disclosure.

FIG. 4 is a cross-sectional view of an electronic device along a line I-I' in FIG. 1 according to the present embodiment. The electronic device of the present embodiment is similar to the electronic device of Embodiment 1, except for the following differences.

In the present embodiment, the display layer 13 does not comprise the first display region 131 and the second display region 132 as shown in FIG. 2.

As shown in FIG. 1 and FIG. 4, the electronic device of the present embodiment comprises: a first substrate 11; a second substrate 15 opposite to the first substrate 11; and a color filter layer 17 disposed between the first substrate 11 and the second substrate 15, wherein the color filter layer 17 comprises a first region 171 and a second region 172, the first region 171 corresponds to the non-sensing region NS, the second region 172 corresponds to the biometric sensing region S, and a reflectivity of the first region 171 is different from a reflectivity of the second region 172. In addition, the electronic device of the present embodiment further comprise a display medium layer 16 disposed between the display layer 13 and the color filter layer 17. The features of the display medium layer 16 are illustrated above, and are not repeated again. In addition, the material used for the first substrate 11 can also be used in the second substrate 15, and is not repeated again.

In the present embodiment, a reflectivity of the first region 171 is different from a reflectivity of the second region 172. In one aspect of the present embodiment, the reflectivity of the first region 171 is less than the reflectivity of the second region 172.

In the present embodiment, the material for the first region 171 of the color filter layer 17 may comprise resin, and the material for the second region 172 of the color filter layer 17 may comprise quantum dots. Because the material for the second region 172 is different from the material for the first region 171, there is a reflectivity difference between the first region 171 and the second region 172, and it could help the users to distinguish the biometric sensing region S corresponding to the second region 172 from the non-sensing region NS corresponding to the first region 171.

Embodiment 4

Figure 5:
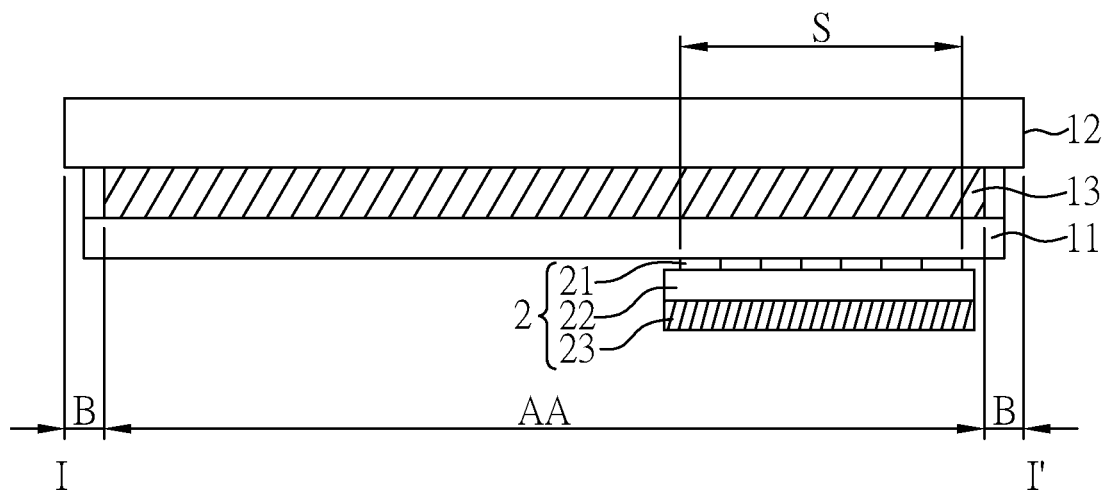
FIG. 5 is a cross-sectional view of an electronic device according to Embodiment 4 of the present disclosure.

FIG. 5 is a cross-sectional view of an electronic device along a line I-I' in FIG. 1 according to the present embodiment. The electronic device of the present embodiment is similar to the electronic device of Embodiment 1, except for the following differences.

In the present embodiment, the display layer 13 does not comprise the first display region 131 and the second display region 132 as shown in FIG. 2.

As shown in FIG. 1 and FIG. 5, the electronic device of the present embodiment comprises a biometric sensing module 2 corresponding to the biometric sensing region S, wherein the biometric sensing module 2 can be an optical sensor module which comprises an optical sensing unit 21, a sensing layer 22, and a sensing circuit layer 23, wherein the sensing layer 22 is disposed between the optical sensing unit 21 and the sensing circuit layer 23, and the sensing layer 22 is electrically connected with the sensing circuit layer 23.

In the present embodiment, by disposing the biometric sensing module 2 corresponding to the biometric sensing region S, a reflectivity of the biometric sensing region S is different from a reflectivity of the non-sensing region NS.

In one aspect of the present embodiment, the reflectivity of the biometric sensing region S is greater than the reflectivity of the non-sensing region NS. When incident light irradiates into the electronic device of the present embodiment, a part of the incident light is reflected, and a part of the incident light is penetrated through the electronic device. In the biometric sensing region S, the incident light may further penetrate through the optical sensing unit 21 and reach to the sensing layer 22. Because the reflectivity of the biometric sensing region S is greater than the reflectivity of the non-sensing region NS due to the disposition of the biometric sensing module 2, an intensity of the reflected light in the biometric sensing region S is greater than an intensity of the reflected light in the non-sensing region NS, so it could help the users to distinguish the biometric sensing region S from the non-sensing region NS.

Embodiment 5

Figure 6:
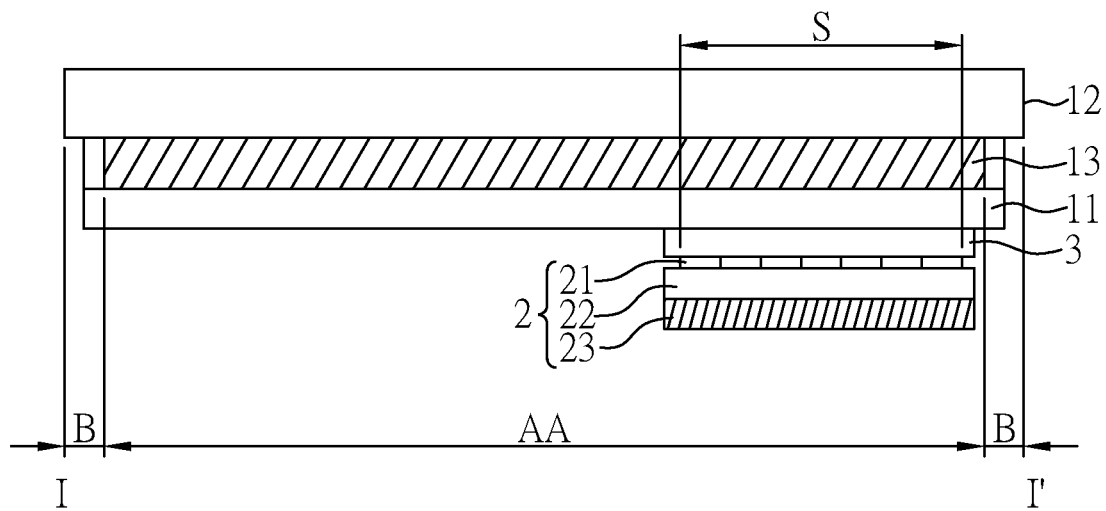
FIG. 6 is a cross-sectional view of an electronic device according to Embodiment 5 of the present disclosure.

FIG. 6 is a cross-sectional view of an electronic device along a line I-I' in FIG. 1 according to the present embodiment. The electronic device of the present embodiment is similar to the electronic device of Embodiment 4, except for the following differences.

In the present embodiment, the electronic further comprises: a light altering member 3 at least partially formed in the biometric sensing region S. Herein, the light altering member 3 is disposed between the first substrate 11 and the biometric sensing module 2.

Herein, the light altering member 3 is a member capable of altering the physical properties of the incident light, e.g. altering the intensity of the incident light in different wavelengths, changing the direction of the incident angle of the incident light, or reflecting the incident light with particular wavelengths, etc.

Hereinafter, several examples for the light altering member 3 are illustrated, but the present disclosure is not limited thereto.

Figure 7A:
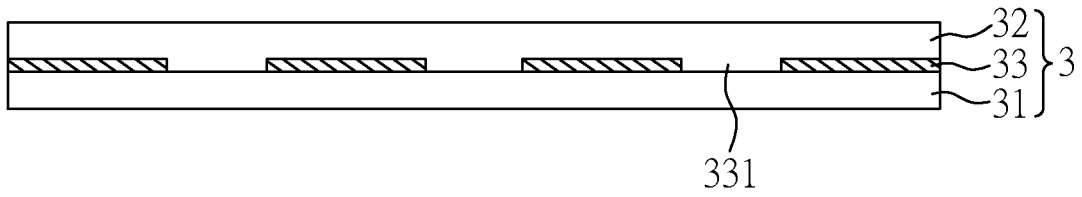
FIG. 7A to FIG. 7F are cross-sectional views of light altering members according to different aspects of the present disclosure.

FIG. 7A is a cross-sectional view of a light altering member in one aspect of the present disclosure. The light altering member 3 comprises a plurality of openings 331. More specifically, the light altering member 3 comprises a first insulating layer 31, a second insulating layer 32 and a reflecting layer 33, the reflecting layer 33 is disposed between the first insulating layer 31 and the second insulating layer 32, and the reflecting layer 33 comprise the plurality of openings 331. By using the light altering member 3 with the openings 331, only a part of the incident light can reach to the biometric sensing module 2 (as shown in FIG. 6). Thus, noise from the incident light can be reduced to increase the sensing performance or resolution of the biometric sensing module 2. Herein, the first insulating layer 31 and the second insulating layer 32 may respectively comprise silicon oxide, silicon oxynitride, silicon nitride, aluminum oxide, resin, polymer, photoresist, or a combination thereof, but the present disclosure is not limited thereto. The reflecting layer 33 may comprise metal such as Ag, Al, or alloy thereof, but the present disclosure is not limited thereto.

Figure 7B:
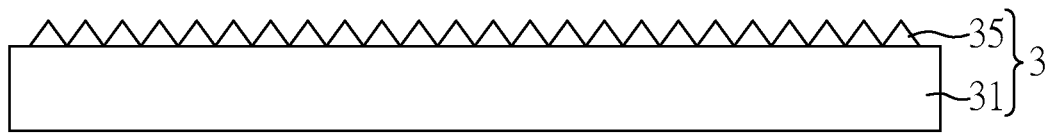

FIG. 7B is a cross-sectional view of a light altering member in another aspect of the present disclosure. The light altering member 3 comprises a first insulating layer 31 and a micro-structure layer 35 disposed on the first insulating layer 31, wherein the micro-structure layer 35 comprises a micro structure with reflective properties. By using the light altering member 3 with the micro structure, noise (e.g. incident light with large angle of incidence, etc) can be reduced to increase the sensing performance or resolution of the biometric sensing module 2. It should be noted that the micro structure of the micro-structure layer 35 is not limited to that shown in FIG. 7B, and the shape of the micro structure can be adjusted according to the need. The micro-structure layer 35 may be a prism layer or a lens layer, but the present disclosure is not limited thereto.

Figure 7C:
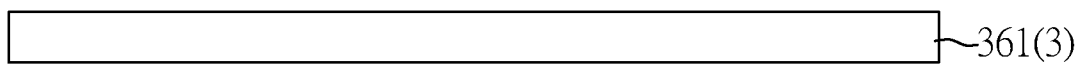
Figure 7D:
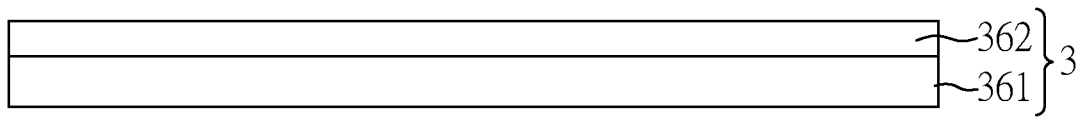

FIG. 7C is a cross-sectional view of a light altering member in another aspect of the present disclosure. The light altering member 3 may comprise a first low refractive layer 361, wherein the first low refractive layer 361 comprises a material with a refractive index lower than the first substrate 11. FIG. 7D is a cross-sectional view of a light altering member in another aspect of the present disclosure. The light altering member 3 comprises a first low refractive layer 361 and a second low refractive layer 362 disposed on the first low refractive layer 361, wherein the first low refractive layer 361 and the second low refractive layer 362 respectively comprise a material with a refractive index lower than the first substrate 11, and the refractive index of the material comprised in the first low refractive layer 361 is different from the refractive index of the material comprised in the second low refractive layer 362.

For example, if the first substrate 11 has a refractive index of 1.5, the first low refractive layer 361 and the second low refractive layer 362 may respectively comprise a material with a refractive index lower than 1.5. In one embodiment of the present disclosure, the refractive index difference between the first low refractive layer 361 and the first substrate 11 can be ranged from 0.09 to 0.2, the refractive index difference between the second low refractive layer 362 and the first substrate 11 can be ranged from 0.09 to 0.2, so the first low refractive layer 361 and the second low refractive layer 362 may comprise a material with a refractive index ranged from 1.30 to 1.41. In another embodiment of the present disclosure, the refractive index difference between the first low refractive layer 361 and the first substrate 11 can be ranged from 0.09 to 0.18, the refractive index difference between the second low refractive layer 362 and the first substrate 11 can be ranged from 0.09 to 0.18, so the first low refractive layer 361 and the second low refractive layer 362 may comprise a material with a refractive index ranged from 1.32 to 1.41. However, the present disclosure is not limited thereto.

It should be noted that, FIG. 7C and FIG. 7D show the aspects that the light altering member 3 comprises one or two low refractive layers, but the present disclosure is not limited thereto. In other embodiments of the present disclosure, the light altering member 3 may comprise two or more low refractive layers as long as the two or more low refractive layers comprise a material with a refractive index lower than the first substrate 11.

In the present disclosure, the reflectivity of the biometric sensing region S is different from the non-sensing region NS. In one embodiment, the reflectivity of the biometric sensing region S could be less than the non-sensing region NS by using the light altering member 3 with suitable material or structure. But, the present disclosure is not limited thereto.

Figure 7E:
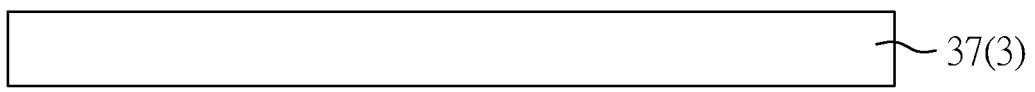

FIG. 7E is a cross-sectional view of a light altering member in another aspect of the present disclosure. The light altering member 3 may comprise a wavelength converting film 37. The wavelength converting film 37 can filter the light with undesired wavelength and let the light with desired wavelength penetrate through the wavelength converting film 37 to reach to the biometric sensing module 2 (as shown in FIG. 6). In one embodiment of the present disclosure, the wavelength converting film 37 may further convert the light with undesired wavelength into the light with desired wavelength, and the converted light may penetrate through the wavelength converting film 37 to reach to the biometric sensing module 2 (as shown in FIG. 6). Thus, the sensing performance or resolution of the biometric sensing module 2 can further be improved. Examples of the wavelength converting film 37 may comprise a color filter film, a quantum dot film or a resin film, but the present disclosure is not limited thereto.

Figure 7F:
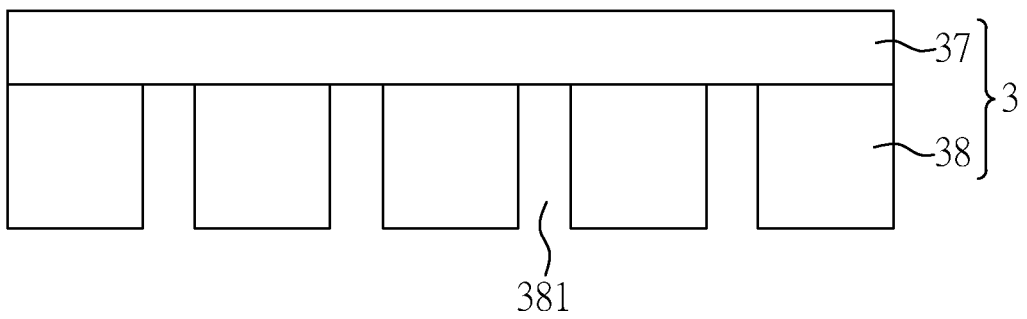

FIG. 7F is a cross-sectional view of a light altering member in another aspect of the present disclosure. The light altering member 3 may further comprises a reflecting layer 38 disposed under the wavelength converting film 37, and the reflecting layer 38 comprises a plurality of openings 381. By using the reflecting layer 38 with the openings 381, only a part of the incident light can reach to the biometric sensing module 2 (as shown in FIG. 6). Thus, noise from the incident light can be reduced to increase the sensing performance or resolution of the biometric sensing module 2. In another embodiment of the present disclosure, the material of the wavelength converting film 37 may also fill into the openings 381 of the reflecting layer 38.

In Embodiment 5 of the present disclosure, the light altering member 3 is disposed between the first substrate 11 and the biometric sensing module 2, as shown in FIG. 6. However, the present disclosure is not limited thereto and the light altering member 3 can be disposed in different positions of the electronic device, as long as the light altering member 3 corresponds to the biometric sensing module 2 in the biometric sensing region S.

Figure 8A:
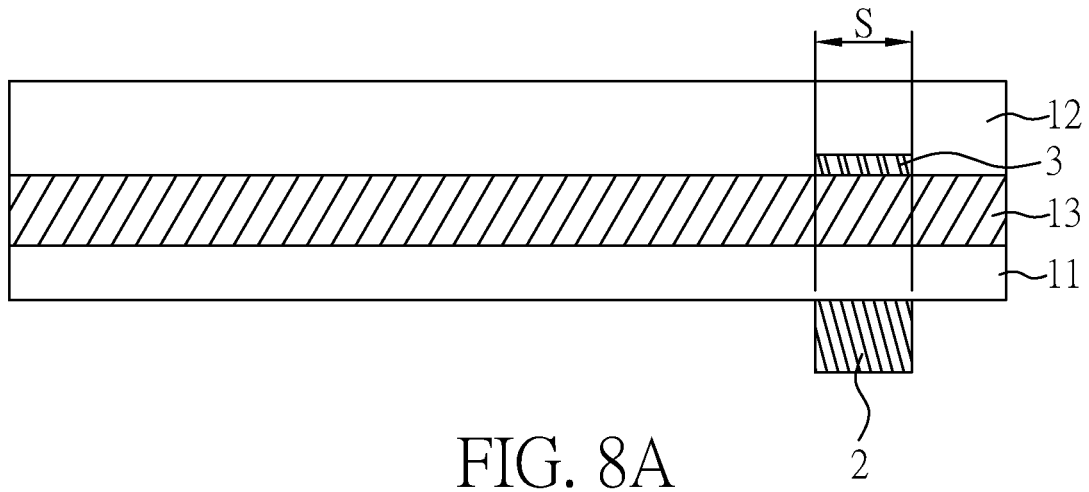
FIG. 8A to FIG. 8C are cross-sectional views of electronic devices according to different aspects of the present disclosure.
Figure 8B:
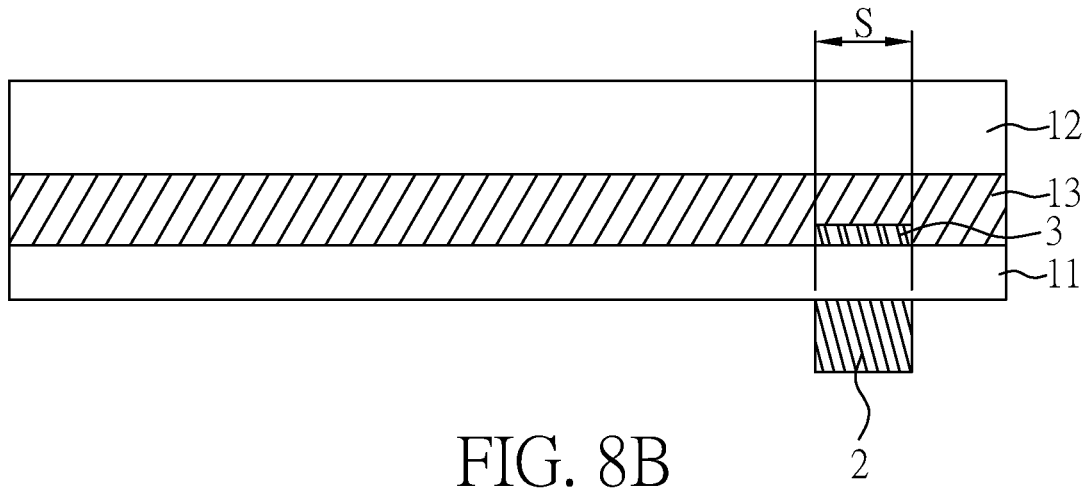
Figure 8C:
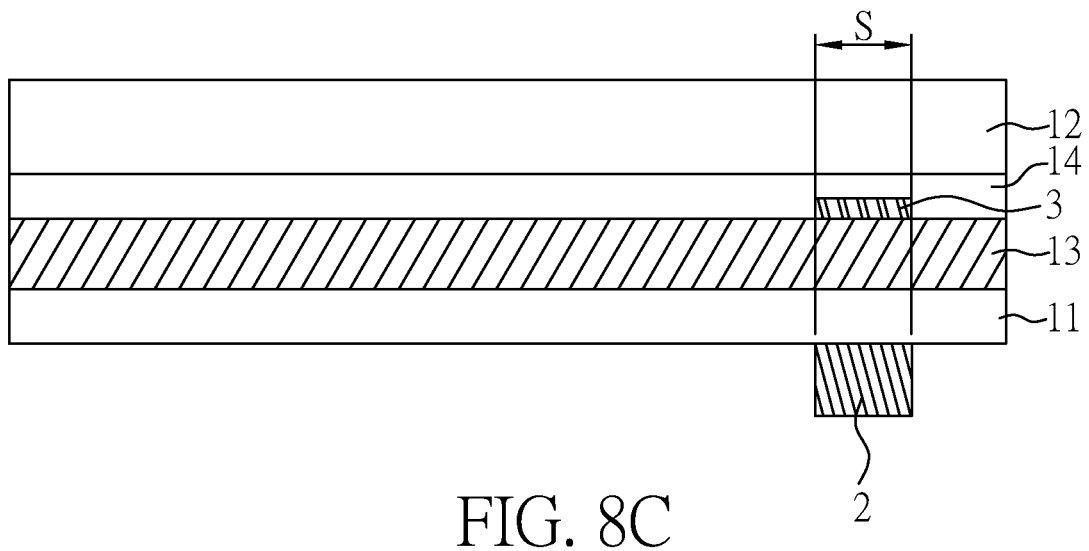

FIG. 8A to FIG. 8C are cross-sectional views of electronic devices according to different aspects of the present disclosure. As shown in FIG. 8A, the light altering member 3 is disposed on the display layer 13, and the light altering member 3 is disposed between the display layer 13 and the cover substrate 12. As shown in FIG. 8B, the light altering member 3 is disposed between the first substrate 11 and the display layer 13. As shown in FIG. 8C, the light altering member 3 is disposed between the first substrate 11 and the touch sensing layer 14, or the light altering member 3 is disposed between the display layer 13 and the touch sensing layer 14. As shown in FIG. 8A to FIG. 8C, the light altering member 3 is at least partially formed in the biometric sensing region S, and more specifically, the light altering member 3 corresponds to the biometric sensing module 2 in the biometric sensing region S.

Herein, the light altering members 3 shown in FIG. 7A to FIG. 7F can be used in the electronic devices shown in FIG. 8A to FIG. 8C.

Figure 9A:
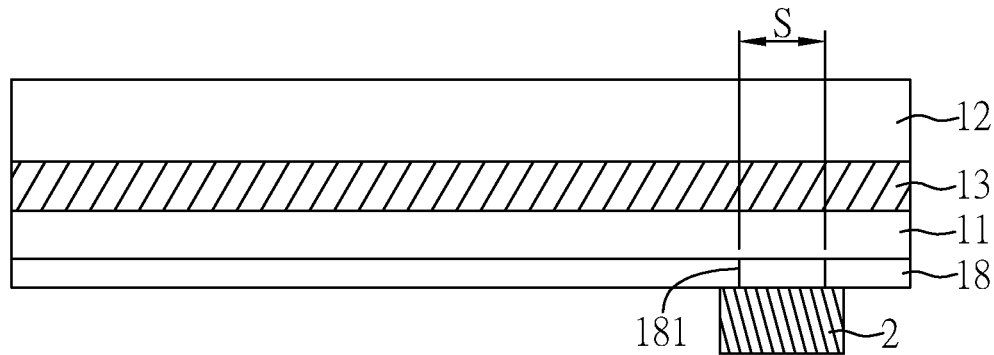
FIG. 9A to FIG. 9D are cross-sectional views of electronic devices according to different aspects of the present disclosure.
Figure 9B:
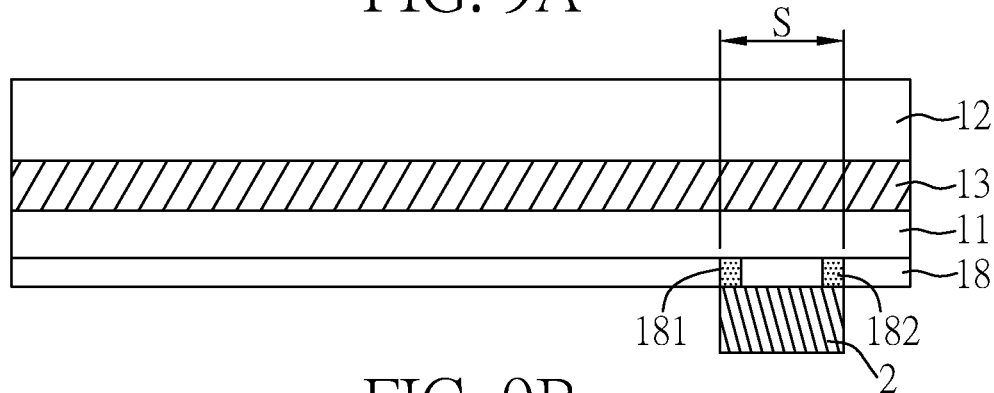
Figure 9C:
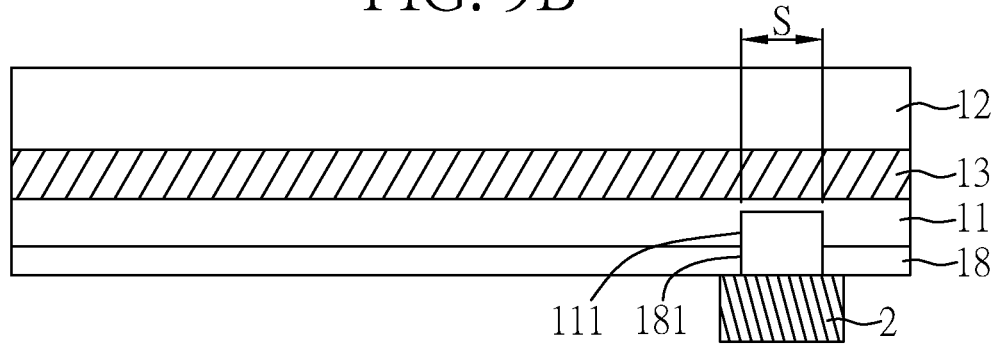
Figure 9D:
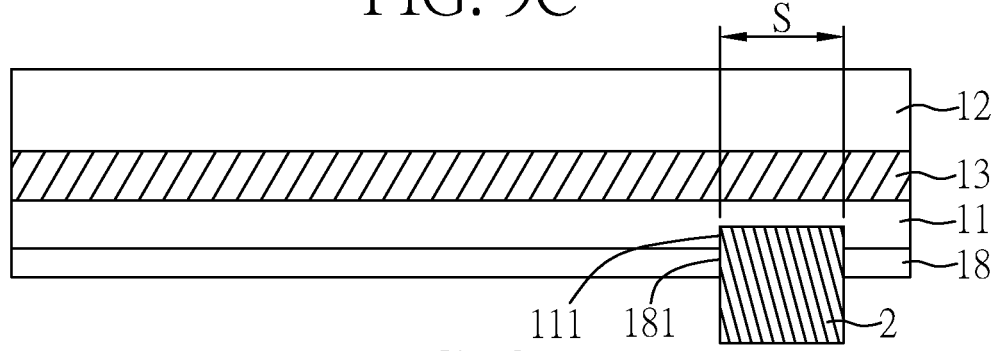

FIG. 9A to FIG. 9D are cross-sectional views of electronic devices according to different aspects of the present disclosure. As shown in FIG. 9A, the electronic device may further comprise a supporting film 18 disposed under the first substrate 11 and having a hole 181, wherein the biometric sensing module 2 is disposed under the first substrate 11 and corresponds to the hole 181. Because the material of the supporting film 18 usually has poor transmittance, the hole 181 in the supporting film 18 is required for the biometric sensing module 2. In addition, the reflectivity of the biometric sensing region S is different from the reflectivity of the non-sensing region NS (as shown in FIG. 1) due to the formation of the hole 181. Furthermore, the transmittance of the electronic device in the biometric sensing region S is different from the transmittance of the electronic device in the non-sensing region NS (as shown in FIG. 1) due to the formation of the hole 181. As shown in FIG. 9B, the electronic device may further comprise an adhesive layer 182 forming on a sidewall of the hole 181, and the adhesive layer 182 could increase the adhesion of the biometric sensing module 2 on the supporting film 18. As shown in FIG. 9C, the first substrate 11 may also have a hole 111 corresponding to the hole 181. Because the thickness of the first substrate 11 corresponding to the biometric sensing module 2 is reduced by forming the hole 111, the intensity of the light reaching the biometric sensing module 2 could be increased. In addition, as shown in FIG. 9D, the biometric sensing module 2 may be disposed into the hole 181 and the hole 111, shortening the path required for the light to reach the sensing module 2.

In any of the electronic devices illustrated above, the electronic device could be further designed or configured to display an icon to hint or emphasize where the biometric sensing region is. The icon could overlap with the biometric sensing region but could have different size and different shape with the biometric sensing region.

Hereinafter, the method to identify the biometric sensing region and the non-sensing region of the electronic device is exemplified.

The reflectivity of the electronic device is measured using a spectrophotometer. As shown in FIG. 1, the reflectivity of one point (M point) in the non-sensing region NS and one point (N point) in the biometric sensing region S is measured. The spectrophotometer could be directly placed on and come into contact with the surface of the screen within the display area of an intact mobile phone (without destruction or disassembling) to measure the reflectivity. The reflectivity data at each point could be measure one time or more than one time. The reflectivity of the screen could also be measured at more than one angle (e.g. the mobile phone is placed on the table and rotated 90 degrees clockwise, and the reflectivity is measured; that is, the screen of the mobile phone is measured at different angles to obtain its reflectivity). If the measurement angle is more than one or if the measurement number is more than one, the average of the measured reflectivity should be considered. The reflectivity of different points is then measured and compared. If the reflectivity difference between two points is more than 4%, the reflectivity between two points could be considered to have significant difference. That is, if the reflectivity difference between two points is more than 4%, two points could be considered to locate in different region (e.g. one point is located in the biometric sensing region S and the other one is located in the non-sensing region NS). However, the present disclosure is not limited to this measurement method, and other suitable methods to measure the reflectivity could be used.

In the present disclosure, at least two electronic devices can be arranged in juxtaposition to form a tiled electronic device. The at least two electronic devices can be the same or different, which can be selected from the electronic device made as described in any of the embodiments of the present disclosure as described previously.

The display panel and the display device made as described in any of the embodiments of the present disclosure as described previously can be co-used with a touch panel to form a touch display device. Meanwhile, a display device or touch display device may be applied to any electronic devices known in the art that need a display screen, such as displays, mobile phones, laptops, video cameras, still cameras, music players, mobile navigators, TV sets, and other electronic devices that display images.

Although the present disclosure has been explained in relation to its embodiment, it is to be understood that many other possible modifications and variations can be made without departing from the spirit and scope of the disclosure as hereinafter claimed.

What is claimed is:

1. An electronic device, comprising:
a substrate comprising a biometric sensing region and a non-sensing region;
a biometric sensing module disposed corresponding to the biometric sensing region;
a display layer disposed on the substrate;
a light altering member at least partially disposed in the biometric sensing region;
a touch sensing layer disposed on the display layer, wherein the touch sensing layer comprises a first touch sensing region and a second touch sensing region, the first touch sensing region corresponds to the non-sensing region, and the second touch sensing region corresponds to the biometric sensing region;
a supporting element disposed between the substrate and the biometric sensing module; and
a display medium layer disposed on the substrate, wherein the substrate is disposed between the display medium layer and the biometric sensing module,
wherein the light altering member comprises a first insulating layer and a micro-structure layer disposed on the first insulating layer;
wherein a density of touch units in the first touch sensing region is different from a density of touch units in the second touch sensing region.

2. The electronic device of claim 1, wherein a material of the supporting element has poor light transmittance.

3. The electronic device of claim 1, wherein the supporting element comprises a hole, and the biometric sensing module is disposed corresponding to the hole.

4. The electronic device of claim 1, wherein the display layer comprises a plurality of conductive lines.

5. The electronic device of claim 4, wherein a density of the conductive lines in an area corresponding to the biometric sensing region is different from that in an area corresponding to the non-sensing region.

6. The electronic device of claim 1, wherein the light altering member is disposed between the substrate and the biometric sensing module.

7. The electronic device of claim 1, further comprising a color filter layer disposed on the substrate.

8. The electronic device of claim 1, wherein the display medium layer comprises a liquid crystal material.

9. The electronic device of claim 1, wherein the display medium layer comprises light-emitting diodes.

* * * * *